(12) United States Patent
Bieck et al.

(10) Patent No.: US 9,076,779 B1
(45) Date of Patent: *Jul. 7, 2015

(54) PACKAGING OF ELECTRONIC CIRCUITRY

(75) Inventors: Florian Bieck, Newport (GB); Robert J. Montgomery, Marshfield Cardiff (GB)

(73) Assignee: International Rectifier Corporation, El Segundo, CA (US)

( * ) Notice: Subject to any disclaimer, the term of this patent is extended or adjusted under 35 U.S.C. 154(b) by 278 days.

This patent is subject to a terminal disclaimer.

(21) Appl. No.: 13/438,707

(22) Filed: Apr. 3, 2012

Related U.S. Application Data

(60) Provisional application No. 61/604,966, filed on Feb. 29, 2012.

(51) Int. Cl.
*H01L 23/50* (2006.01)
*H01L 23/495* (2006.01)

(52) U.S. Cl.
CPC .................... *H01L 23/49541* (2013.01)

(58) Field of Classification Search
CPC .................... H01L 21/768; H01L 23/48
See application file for complete search history.

(56) References Cited

U.S. PATENT DOCUMENTS 8,581,343 B1 * 11/2013 Desbiens et al. .............. 257/341

* cited by examiner

*Primary Examiner* — Fernando L Toledo
*Assistant Examiner* — Valerie N Newton
(74) *Attorney, Agent, or Firm* — Chapin IP Law, LLC

(57) ABSTRACT

The present disclosure includes novel techniques to provide wafer level fan-outs in electronic circuit packages housing one or more circuit devices, at least one of which has input and/or output nodes disposed on opposite facings.

18 Claims, 16 Drawing Sheets

PACKAGING OF ELECTRONIC CIRCUITRY

RELATED APPLICATIONS

This application is related to and claims the benefit of earlier filed U.S. Provisional Patent Application Ser. No. 61/604,966 entitled "FANOUT WAFERLEVEL PACKAGING FOR POWERCHIPS," filed on Feb. 29, 2012, the entire teachings of which are incorporated herein by this reference.

BACKGROUND

Conventional Surface-Mount Technology (SMT) provides a way of interconnecting electronic circuit components. For example, according to conventional surface mount technology, electronic devices can be specifically packaged for subsequent mounting directly on a respective surface of a printed circuit board. Because of the advantages associated with surface mount technology such as smaller part size, surface mount technology has, to a large extent, replaced so-called through-hole technology in which wire leads of components are fitted and soldered into holes of a printed circuit board to alternatively provide connectivity.

Surface mount devices can be packaged according to a variety of different styles. For example, a surface mount device can have relatively small leads or no leads extending from the package at all. Because a surface mount device has relatively small leads or no leads at all, a surface mount device is usually smaller than its through-hole (e.g., pin-based) counterpart. The surface mount device may have short pins or leads of various styles, flat contacts, a matrix of solder balls (such as Ball Grid Arrays), or terminations on the body of the component.

According to one conventional application, surface mount devices also can be designed to include internal bond wires connecting nodes of an integrated circuit to pads of the surface mount device. The pads of the surface mount device can then be connected to a respective circuit board.

In many cases, the density of nodes on a semiconductor chip is so high that directly mounting the nodes of the chip to a corresponding circuit would be difficult if not impossible. As an alternative to utilizing conventional bond wires to provide connectivity, conventional techniques include creating so-called Fan-Out Wafer-Level (FOWL) type packages.

In accordance with conventional FOWL packaging techniques, each of one or more nodes residing on a single side of a semiconductor chip in an electronic circuit package extend outward via a respective fan-shaped conductive path to a corresponding solder ball or surface mount pad of a respective electronic circuit package encapsulating the chip. Thus, corresponding surface pads of the electronic circuit package can be sufficiently "fanned out" from a single side of the semiconductor chip such that it is possible to mount the electronic circuit package (and semiconductor chip therein) to a circuit board.

BRIEF DESCRIPTION

Conventional applications such as those as discussed above can suffer from a number of deficiencies. For example, conventional FOWL techniques apply only to chips in which all of the nodes of a semiconductor chip reside on the same side. In other words, conventional FOWL techniques do not lend themselves or apply when creating a fan-out wafer-level package for a two-sided circuit device (e.g., a chip having nodes on both facings).

Embodiments herein deviate with respect to conventional applications. For example, embodiments herein include novel circuit packaging techniques to create fan-out wafer level electronic circuit packages using one or more circuits having at least one node on each of multiple facings of a circuit device disposed in the electronic circuit package.

More specifically, one embodiment herein includes producing a novel electronic circuit package via wafer-level processing. By way of a non-limiting example, an assembler receives a circuit device. The assembler bonds a first facing of the circuit device to a (temporary) substrate that provides rigidity. The first facing of the circuit device can include one or more electrical contact nodes. As discussed herein, the temporary substrate is eventually removed to expose the first facing.

Initially, a non-processed second facing of the circuit device disposed opposite the first facing may not include any electrical contact nodes on it. However, embodiments as discussed herein can include creating at least one node on a facing of the circuit device opposite the first facing of the circuit device. For example, subsequent to bonding the first facing of the circuit device to the substrate, the assembler applies an overmold layer (e.g., non-conductive material) to at least fill in a portion of the volume adjacent the circuit device. The overmold layer may cover the second facing of the circuit device opposite the first facing. The overmold layer can include voids (e.g., regions of no material) in one or more locations adjacent the circuit device to expose at least one region on the surface of the substrate.

Form a direction of the second facing of the circuit device, the assembler removes a portion of a layer of material from the circuit device (e.g., backside) and/or a portion of the overmold layer. Removal of the material exposes a new face of the circuit device opposite the first facing of the circuit device. For example, embodiments herein can include removing of the material via grinding. The amount of grinding can be controlled to adjust a thickness of the circuit device between the first facing and the (newly exposed) second facing. The thickness of the circuit device may have an impact on a parameter such as the $R_{DSON}$ associated with the circuit device.

In further embodiments, the assembler provides a layer of electrically conductive material over the newly exposed second facing of the circuit device. The conductive material forms a contact node on the newly exposed second facing of the circuit device. In one embodiment, the layer of electrically conductive material provides an electrically conductive fan-out path from the newly exposed surface of the circuit device (through one or more voids in the overmold layer) to at least one region on the surface of the substrate adjacent the circuit device.

Accordingly, via wafer-level fabrication by the assembler, the assembler provides a fan-out of a multi-sided circuit such as a power chip. In other words, embodiments herein include providing an electrically conductive fan-out path from a drain node created on a newly exposed backside of the circuit device to one or more regions adjacent the circuit device and lying on a planar facing of the circuit device including a gate node and a source node.

In one embodiment, the circuit device is a field effect transistor device. The first facing of the circuit device includes a gate node and a source node; the newly exposed second facing of the circuit device (after the step of removing material from the circuit device) becomes the drain node of the field effect transistor.

Note that embodiments herein further include: removing the temporary substrate to: i) expose one or more electrical contacts (e.g., gate node, source node, etc.) on the first facing of the circuit device, and ii) expose a portion of the layer of conductive material in the at least one region adjacent to the circuit device. Recall that the layer of electrically conductive material provides an electrically conductive path from the at least one region to a drain node formed on the new second facing of the circuit device.

In accordance with yet further embodiments, the assembler produces a respective electrically conductive bump: i) on each of the at least one contacts (e.g., gate node, source node, etc.) on the first facing of the circuit device and ii) on each exposed portion of the layer of conductive material in the at least one region (e.g., path to the drain node) adjacent the circuit device.

In accordance with yet further alternative embodiments, the assembler can be configured to apply conductive adhesive above the layer of conductive material forming the drain node. To the adhesive, the assembler affixes a metal plate such as a heat sink. Via the heat sink above the layer of conductive material, heat generated by the circuit device can be safely dissipated.

These and other more specific embodiments are disclosed in more detail below.

As discussed herein, techniques herein are well suited for use in different electronic circuit package applications such as field effect transistors, switches, semiconductor or circuit devices having input/output nodes on opposite facings, chips, etc. However, it should be noted that embodiments herein are not limited to use in such applications and that the techniques discussed herein are well suited for other applications as well.

Additionally, note that although each of the different features, techniques, configurations, etc., herein may be discussed in different places of this disclosure, it is intended, where appropriate, that each of the concepts can optionally be executed independently of each other or in combination with each other. Accordingly, the one or more present inventions as described herein can be embodied and viewed in many different ways.

Also, note that this preliminary discussion of embodiments herein purposefully does not specify every embodiment and/or incrementally novel aspect of the present disclosure or claimed invention(s). Instead, this brief description only presents general embodiments and corresponding points of novelty over conventional techniques. For additional details, summary, and/or possible perspectives (permutations) of the invention(s), the reader is directed to the Detailed Description section and corresponding figures, which includes a further summary of embodiments.

BRIEF DESCRIPTION OF THE DRAWINGS

The foregoing and other objects, features, and advantages of the invention will be apparent from the following more particular description of preferred embodiments herein, as illustrated in the accompanying drawings in which like reference characters refer to the same parts throughout the different views. The drawings are not necessarily to scale, with emphasis instead being placed upon illustrating the embodiments, principles, concepts, etc.

DETAILED DESCRIPTION OF PREFERRED EMBODIMENTS

Embodiments herein are useful over conventional technology. For example, certain fan-out wafer level techniques as discussed herein support:

1.) producing electronic circuit packages of reduced size as a package can be just slightly larger than volume occupied by the outer dimensions of a circuit device such as a chip;

2.) producing electronic circuit packages at lower costs since many of the process steps can be done at a waferlevel, and most of the mechanical components are not discrete parts, but created in-situ on waferlevel;

3.) producing a switch device in an electronic circuit package to have lower $R_{DSON}$ values since the electrical pathway is minimized due to the small packages size;

4.) improving heat dissipation in an electronic circuit package since a heat dissipating elements can be integrated into the electronic circuit package;

5.) performing SFM metallization at a later processing stage, reducing a cost of fabricating an electronic circuit package.

Figure 1:
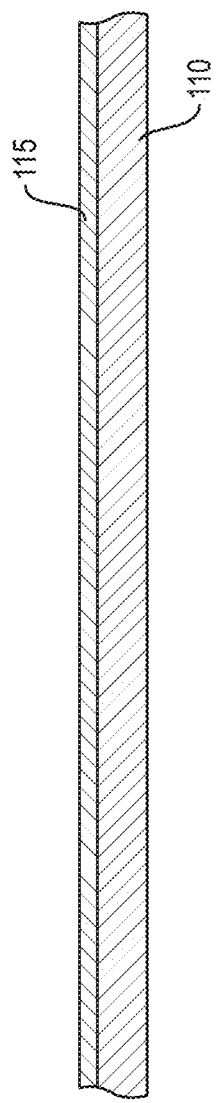
FIG. 1 is an example side view diagram of a temporary substrate on which to perform wafer-level processing according to embodiments herein.

Now, more specifically, FIG. 1 is an example side view diagram of a temporary substrate on which to perform waferlevel processing according to embodiments herein.

In general, shows an initial configuration. It consists of a substrate 110 such as a glass plate. By way of a non-limiting example, the substrate 110 can be circular (from top view) and have a diameter of 200 . . . 300 millimeters, and thickness of ~1 . . . 5 mm, which is typically sufficient for mechanical stability. In one example embodiment, on top of the substrate 110 is a laminated adhesive layer 115 such as an adhesive tape, which adheres to the substrate 110.

Figure 2A:
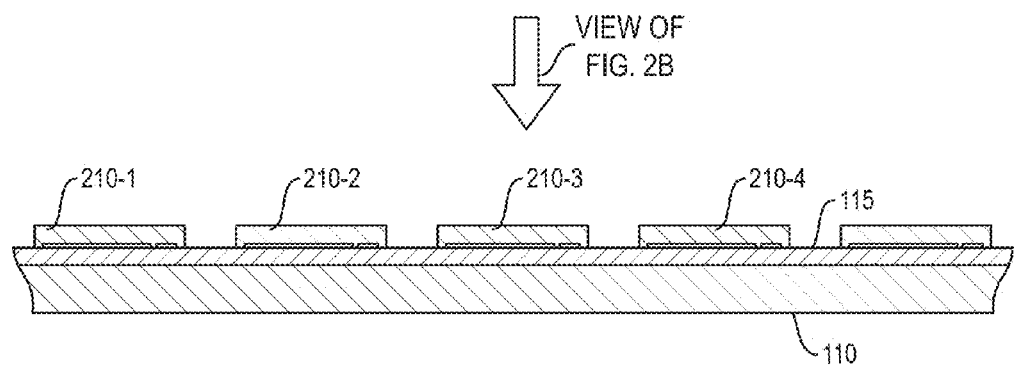
FIG. 2A is an example side view diagram of multiple circuit devices disposed on a temporary substrate according to embodiments herein.

FIG. 2A is an example side view diagram of multiple circuit devices disposed on a temporary substrate according to embodiments herein.

Embodiments herein include a die-bonding operation in which one or more circuit devices 210 such as power chips are bonded face down to the substrate 110 via adhesive layer 115. The adhesive layer 115 ensures that the circuit devices 210 stick properly to the substrate 110.

In accordance with another embodiment, the group of circuit devices 210 can be part of a single circular wafer; a facing of which is coupled to the substrate 110 via the adhesive layer 115. Alternatively, the circuit devices may be cut from a common wafer prior to being bonded to the substrate 110. In other words, the circuit devices 210 can be diced from a wafer prior to placement on the substrate 110.

In one embodiment, each of the circuit devices 210 initially does not have any kind of backside metal or node. Instead, the backside of the circuit devices 210 initially consists of just Silicon material associated with a respective circuit device 210.

By way of a non-limiting example, the circuit devices 210 are not thinned down prior to bonding. The circuit devices can have any suitable thickness such as a thickness of approximately 700 micrometers. Such a thickness provides rigidity, preventing or reducing possible damage to the circuits while handling.

In accordance with further embodiments, the circuit devices 210 initially do not have any kind of solder front metal. For example, the bond pads or nodes on a facing consist only of Aluminum.

Figure 2B:
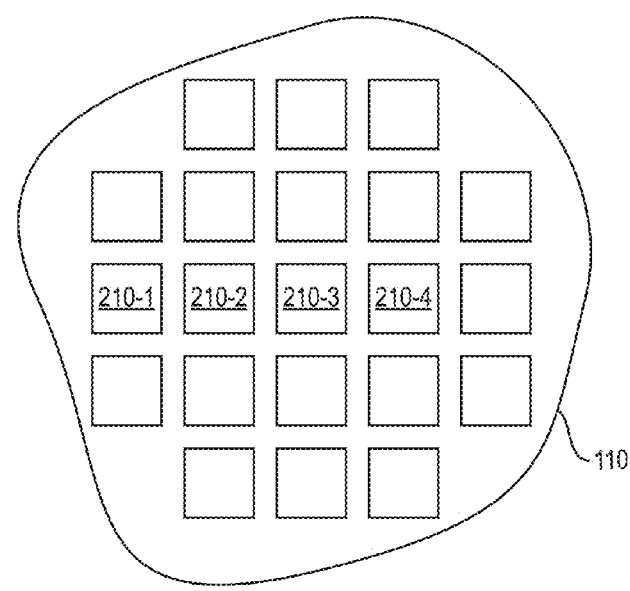
FIG. 2B is an example top view diagram of multiple circuit devices disposed on a temporary substrate according to embodiments herein.

FIG. 2B is an example top view diagram of the multiple circuit devices disposed on a temporary substrate 110 according to embodiments herein.

Figure 3:
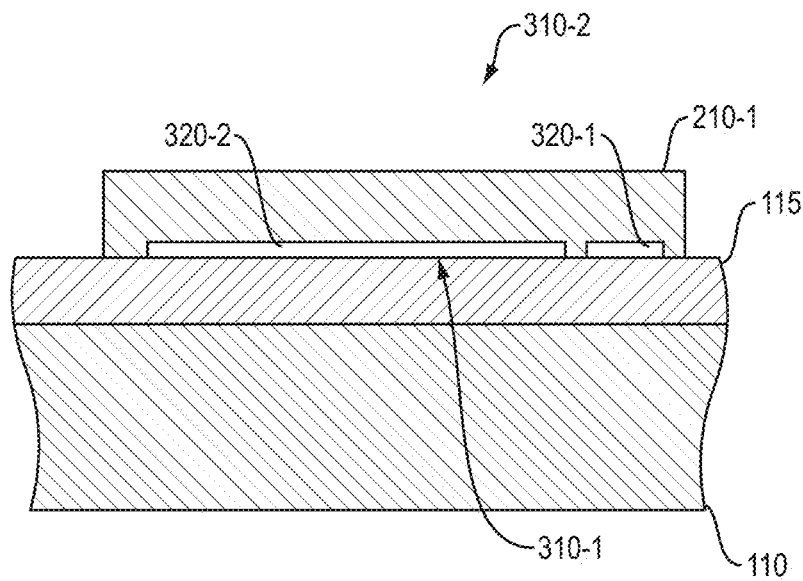
FIG. 3 is an example side view diagram of a circuit device of multiple circuit devices disposed on a temporary substrate according to embodiments herein.

FIG. 3 is an example side view diagram of a circuit device disposed on a temporary substrate according to embodiments herein. Note that the following steps of processing a single circuit device apply to each of the circuit device 210.

In one embodiment, the circuit device 210-1 is a device having at least one input/output node on each of multiple sides such as a power chip. As typical for power chips, field effect transistor devices have a (relatively small gate) node 320-1 and the (relatively large source) node 320-2 on facing 310-1 of the circuit device 210-1. In one non-limiting example embodiment, the node 320-1 is a gate node; node 320-2 is a source node. If not already present, a drain node can be formed in a backside of the circuit device 210-1 as discussed below.

Note that reference to the circuit device 210-1 as a field effect transistor is by way of a non-limiting example only. Notably, the circuit device 210-1 can be any suitable type of device having at least one node on facing 310-1 and at least one node on facing 310-2.

As discussed below, the facing 310-2 can be modified before creating a source node associated with the circuit device 210-1. However, note that certain embodiments herein include a circuit device 210-1 that already has one or more nodes disposed on a backside of the circuit device 210-1. In other words, the facing 310-2 of the circuit device can already have one or more nodes, eliminating the need to perform processing steps to create them.

Figure 4A:
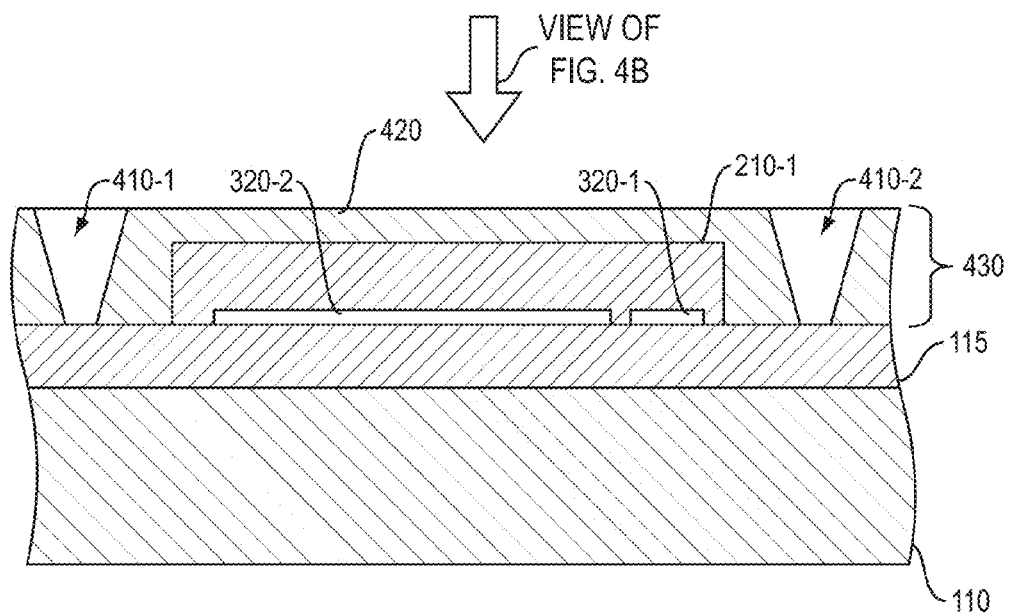
FIG. 4A is an example side view diagram of a circuit device disposed on a temporary substrate and application of a first overmold according to embodiments herein.

FIG. 4A is an example side view diagram of a circuit device disposed on a temporary substrate and application of a first overmold layer according to embodiments herein.

In accordance with one embodiment, the facing of the substrate 110 on which the circuit devices 210 are mounted is overmolded with a non-electrically conductive overmold material 420 such as a non-electrically conductive resin to produce overmold layer 430.

This overmolding can be done in a way that regions 420 (e.g., region 420-1, region 420-2) are not filled with the overmold material 420. In one embodiment, this is achieved by use of a mold chase with blocks at these regions. The corresponding voids (e.g., in a vicinity of regions 410) in the overmold layer 430 provide exposure of a surface of the substrate and/or adhesive layer 115 to which the circuit devices 210 are mounted.

By way of a non-limiting example, as shown, the regions 410 reside to the left and right of the circuit device 210-1. However, note that other configurations are feasible as well. That is, the voids can be located in any suitable location adjacent to the circuit device 210-1.

At this stage, most of the backside of circuit device 210-1 is encapsulated by overmold material 420 (e.g., mold compound). In one embodiment, the overmold layer 430 is approximately 100-200 micrometers above the top surface of the circuit device 210-1.

Figure 4B:
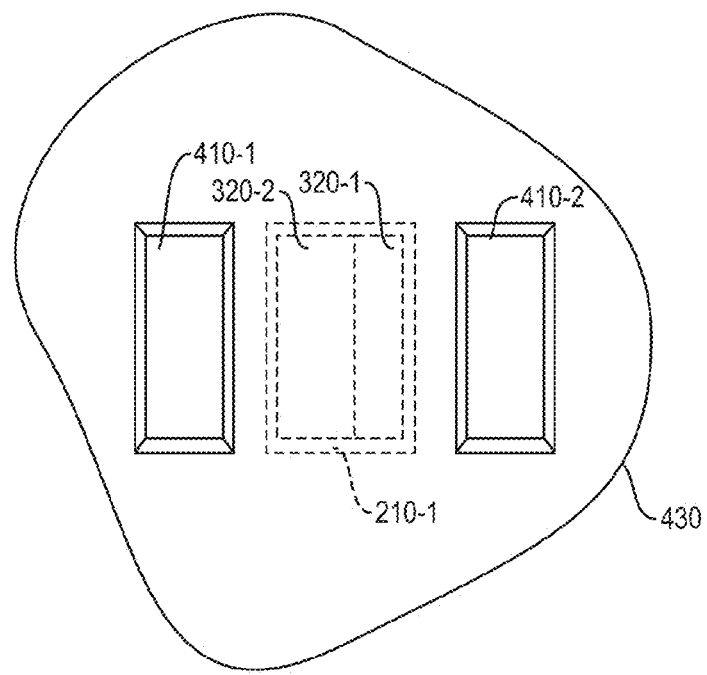
FIG. 4B is an example top view diagram of a circuit device disposed on a temporary substrate and first overmold according to embodiments herein.

FIG. 4B is an example top view diagram of a circuit device disposed on a temporary substrate and application of a first overmold layer according to embodiments herein. Although regions 410 are shown as being channel-like through overmold layer 430, their placement with respect to the circuit device 210-1 and shape can vary depending on the application.

Figure 5A:
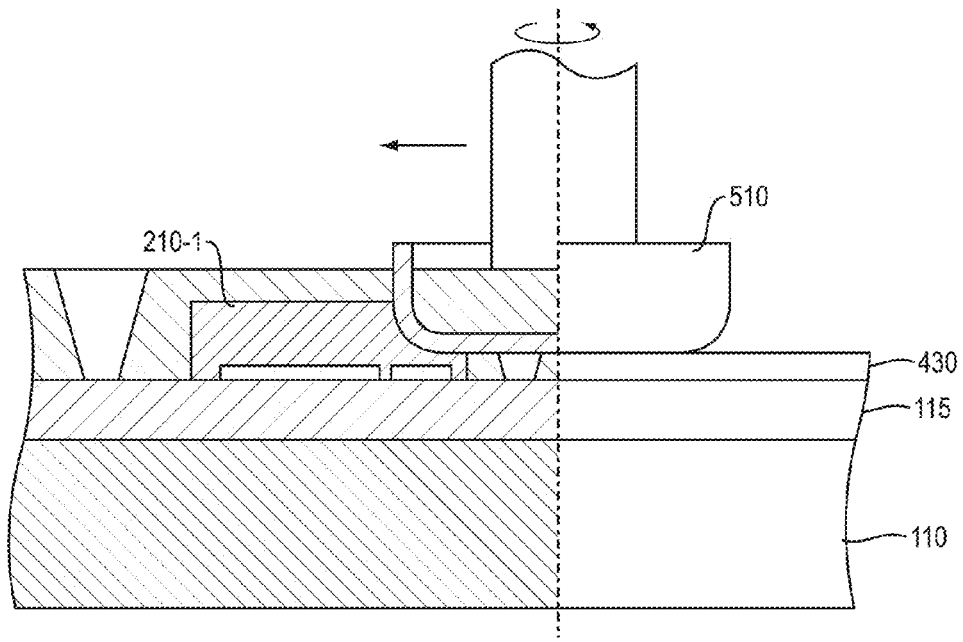
FIG. 5A is an example side view diagram illustrating removal of material according to embodiments herein.
Figure 5B:
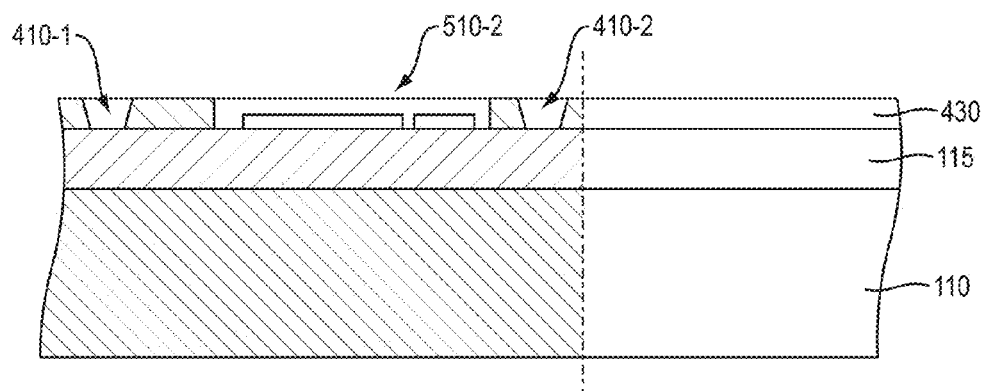
FIG. 5B is an example side view diagram of the circuit device disposed on the temporary substrate after removal of material according to embodiments herein.

FIG. 5A is an example side view diagram illustrating planing and removal of material according to embodiments herein. FIG. 5B is an example side view diagram of the circuit device disposed on the temporary substrate after removal of material according to embodiments herein.

As shown in FIG. 5A, planning tool 510 such as a spinning grinder wheel passes from a topside of circuit device 210-1 to remove a portion of the overmold layer 430 and reduce a thickness of the circuit device 210-1. In one embodiment, the material removal results in a final thickness of both the circuit device 210-1 and the overmold layer 430 is any suitable value such as shown, by way of a non-limiting example, between approximately 5-500 micrometers.

In one embodiment, the thickness of the circuit device 210-1 directly affects performance and parameters of the circuit device. For example, assuming the circuit device 210-1 is a vertical field effect transistor, the $R_{DSON}$ of the circuit device 210-1 varies depending on thickness.

Subsequent to backgrinding of the circuit device 210-1 using tool 510, the top surface of the circuit device 210-1 and overmold layer 430 can be cleaned to remove any unwanted residue. Voids remain in regions 410, exposing the surface of the substrate 110 and/or adhesive layer 115.

Thereafter, embodiments herein include exposing the top surface that was just grinded and cleaned to a plasma silicon etch process in order to remove a stressed layer on the surface resulting from backgrinding.

Figure 6:
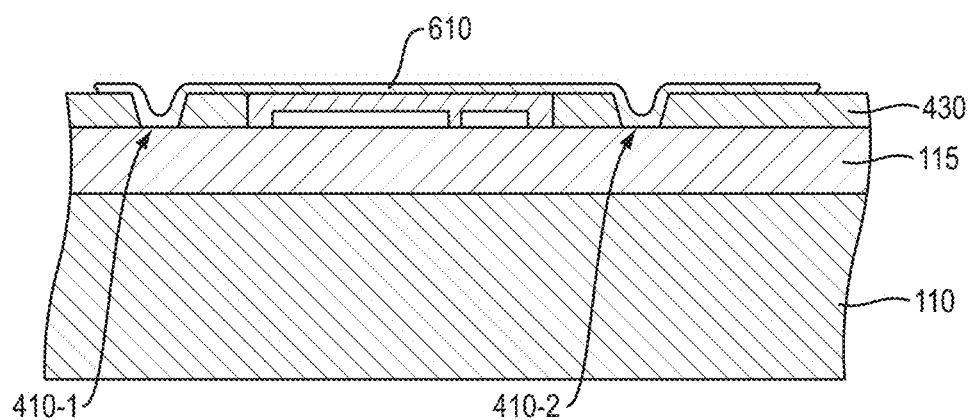
FIG. 6 is an example side view diagram illustrating application of a layer of electrically conductive material according to embodiments herein.

FIG. 6 is an example side view diagram illustrating application of a layer of electrically conductive material according to embodiments herein.

In accordance with further embodiments, the next step in processing can include depositing a layer of material 610 such as metal over the newly exposed surface of the circuit device 210-1 and the overmold layer 430 as shown.

One purpose of the layer of material 610 or metal layer is to provide and/or create an ohmic contact such as a drain node at the backside (i.e., newly exposed area as a result of grinding) of the circuit device 210-1. In other words, in one embodiment, the layer of material 610 provides an ohmic contact to silicon of the circuit device 210-1 on the newly exposed area (e.g., facing 510-2) produced by grinding.

The applied layer of material 610 also provides an electrically conductive path from the backside (such as a drain node) of the circuit device 210-1 to the regions 410 (e.g., region 410-1 and region 410-2) on the surface of substrate 110 and/or adhesive layer 115.

The layer of material 610 can be created in any suitable manner. For example, in one embodiment, the layer of material 610 can be a metal layer created via any suitable technique such as:

i) depositing a Ti layer as barrier layer by PVD,
   ii) depositing a Cu layer as seed layer by PVD,
   iii) electro-deposition of Cu in the range of 5 to 7 micrometers or any suitable thickness, etc.

If desired, the layer of material 610 can be relatively thick in order to produce a sufficiently conductive path from the backside of the circuit device 210-1 to the regions 410.

Figure 7A:
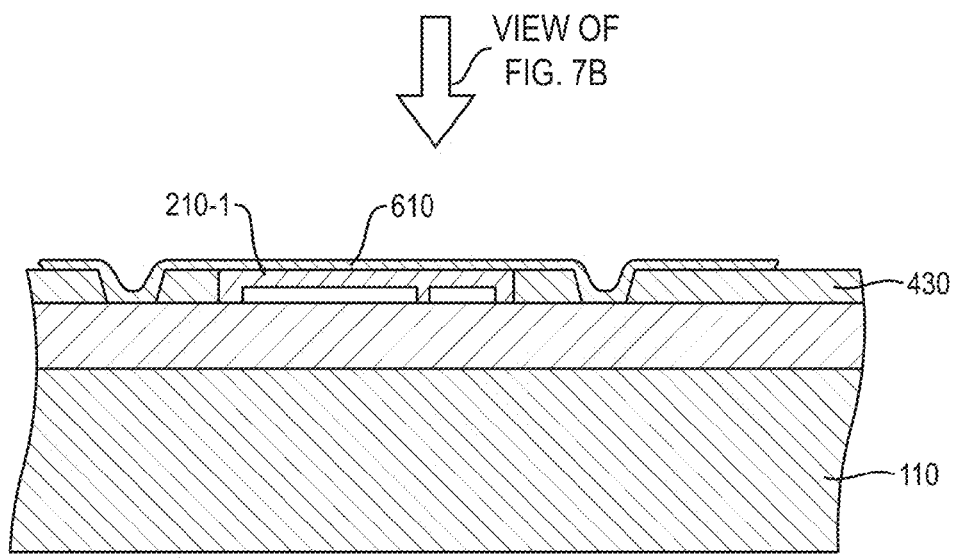
FIG. 7A is an example side view diagram illustrating a circuit device disposed on a temporary substrate according to embodiments herein.
Figure 7B:
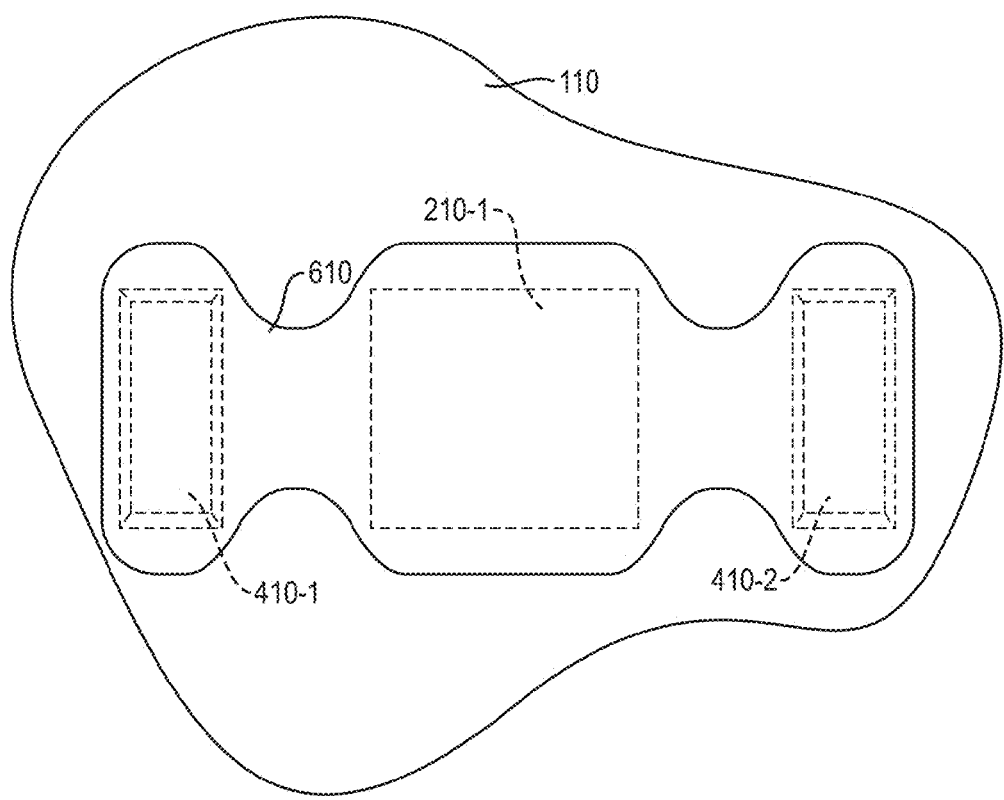
FIG. 7B is an example top view diagram illustrating a circuit device disposed on a temporary substrate according to embodiments herein.

FIG. 7A is an example side view diagram illustrating a circuit device disposed on a temporary substrate according to embodiments herein. FIG. 7B is an example top view diagram illustrating a circuit device and coverage provided by the length of conductive material 610 disposed over the circuit device and remaining portions of the overmold layer according to embodiments herein.

As previously discussed, embodiments herein include providing a localized layer of material 610 over the circuit device 210-1 and overmold layer 430.

In accordance with yet further embodiments, fabrication of the localized layer can include covering the layer of material 610 around the circuit device 210-1 with a photoresist spin or spray coating. Then, the layer of material 610 is then etched, and finally the resist over the circuit device 210-1 is stripped away. FIG. 7B shows a top view of the layer of material 610 (over the circuit device 210-1 and in regions 410) remaining after etching. For example, the layer of material 610 remaining remains in areas where it is required to form an electrical connection from the drain node of the circuit device 210-1 to regions 410 in the overmold layer 430. This optional step of localizing ensures that each of the circuit devices 210 are electrically isolated from each other.

Figure 8:
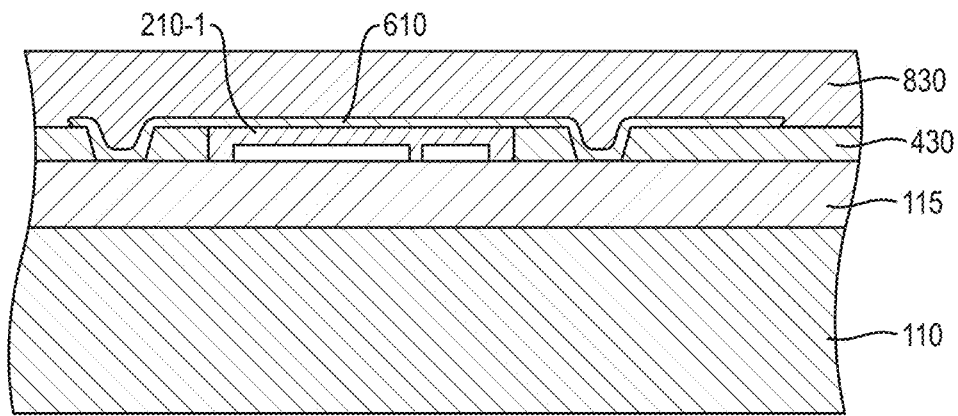
FIG. 8 is an example side view diagram of a circuit device disposed on a temporary substrate and application of a second overmold according to embodiments herein.

FIG. 8 is an example side view diagram of a circuit device disposed on a temporary substrate and application of a second overmold layer according to embodiments herein.

In one embodiment, fabrication includes providing a second overmold layer 830 as shown. The overmold layer 830 contacts layer of material 610. Because the layer of material 610 is localized, portions of the second overmold layer also contact the overmold layer 430 in areas outward from the circuit device 210-1.

As a result of applying the overmold layer, the backside of the circuit device 210—and layer of material 610 becomes encapsulated. By way of a non-limiting example, the overmold layer 830 can be a thickness of approximately 500 to 1500 micrometers or any other suitable value.

Figure 9:
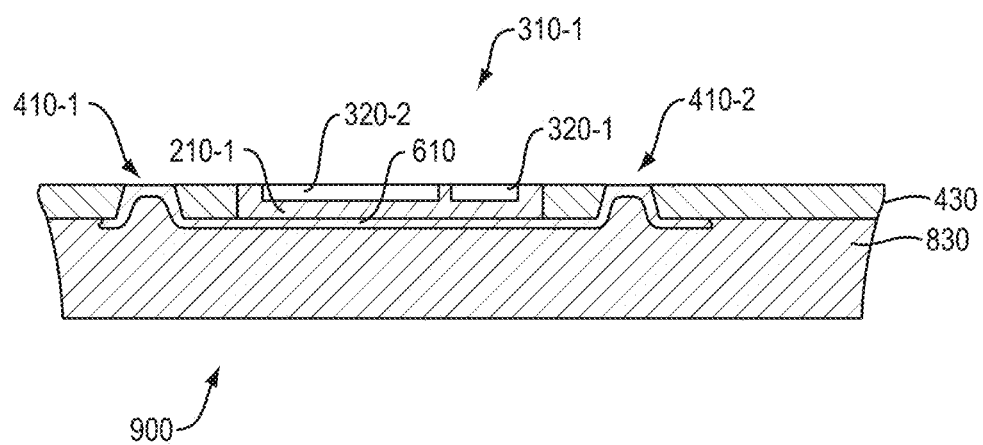
FIG. 9 is an example side view diagram illustrating a circuit assembly subsequent to removal of the temporary substrate according to embodiments herein.

FIG. 9 is an example side view diagram illustrating a circuit assembly subsequent to removal of the temporary substrate according to embodiments herein.

As shown in FIG. 9, the substrate 110 and the adhesive layer 115 can be removed via any suitable fabrication process.

In one embodiment, the layers of circuit assembly 900 (e.g., overmold layer 830 such as a resin, layer of material 610 such as a metal, etc.) provide stability with respect to the circuit device 210-1, which may be quite thin and fragile on its own.

Removal of the substrate 110 and adhesive layer 115 exposes facing 310-1 of the circuit device 210-1. Accordingly, node 320-1 and node 320-2 of circuit device 210-1 are exposed. The corresponding layer of material 610 in regions 410 are also exposed subsequent to removing the substrate 110 and adhesive layer 115. The node disposed on the backside of the circuit device 210-1 is thus connected the facing 310-1 on a substantially same plane as nodes 320-1 and 320-2. In one embodiment, each of the exposed areas associated with regions 410 adjacent the circuit device 210-1 on a planar surface of facing 310-1 represents the same node.

From this point on, by way of a non-limiting example, because the gate node, source node, and drain node reside in substantially the same plane of facing 310-1, the whole configuration can be processed with conventional bumping or redistribution (e.g., RDL) methods.

Figure 10:
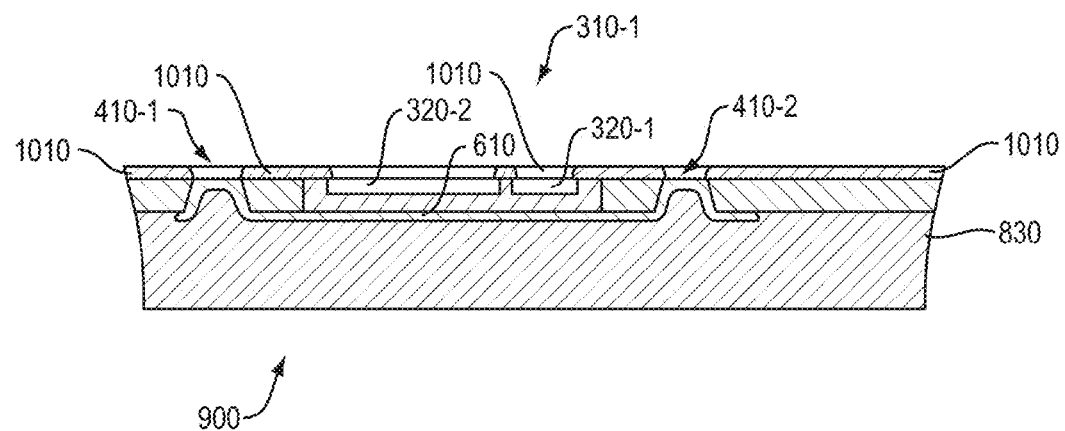
FIG. 10 is an example side view diagram illustrating application of a polyimide layer to an circuit assembly according to embodiments herein.

FIG. 10 is an example side view diagram illustrating application of a layer of material according to embodiments herein.

As shown in FIG. 10, further fabrication of assembly 900 includes applying a layer of material 1010 such as a polyimide layer over at least a portion of exposed facing 310-1 and adjacent areas. In one embodiment, the regions 410 and nodes 320-1 and 320-2 remain exposed after applying the layer of material 1010.

Figure 11:
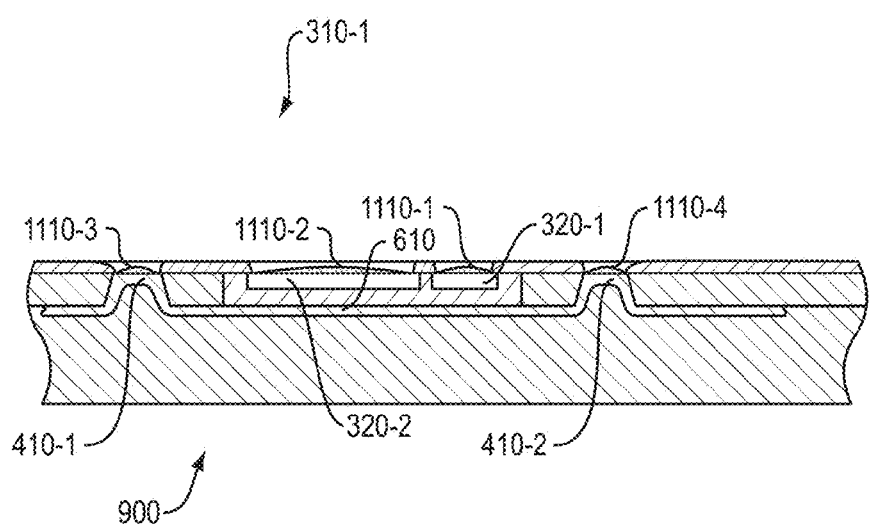
FIG. 11 is an example side view diagram illustrating application of metal to a surface of a circuit assembly according to embodiments herein.

FIG. 11 is an example side view diagram illustrating application of metal to nodes of circuit assembly according to embodiments herein.

As shown in FIG. 11, further fabrication of assembly 900 includes applying a layer of material 1110-3 over exposed region 410-1, layer of material 1110-2 over exposed node 320-2, layer of material 1110-1 over exposed node 320-1, layer of material 1110-4 over exposed region 410-2.

By way of a non-limiting example, the layer of material 1110 can be solderable and/or metal material that is deposited in a vicinity of exposed regions 410 and exposed nodes 320 on facing 310-1.

Figure 12:
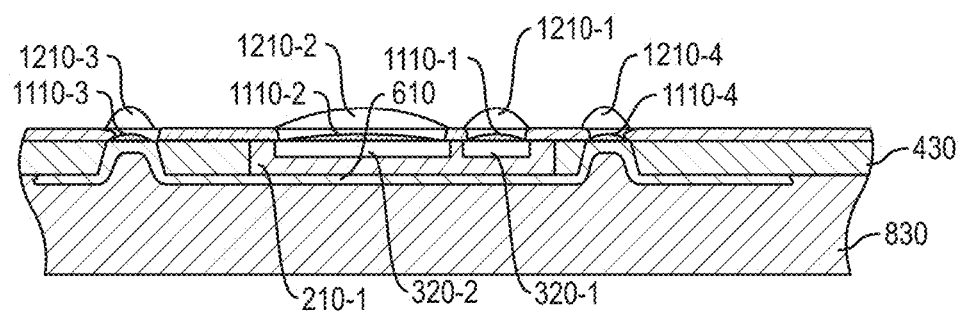
FIG. 12 is an example side view diagram illustrating deposition of bumps on a circuit assembly according to embodiments herein.

FIG. 12 is an example side view diagram illustrating deposition of bumps on a circuit assembly according to embodiments herein.

As shown in FIG. 12, further fabrication of assembly 900 includes applying additional material over layer of material 1110 to produce respective contacts 1210 such as electrically conductive bumps. In one embodiment, the fabrication process includes creating contacts via electrochemical deposition or other suitable method.

In this example embodiment, the contact 1210-3 provides connectivity to layer of material 610 at region 410-1; the contact 1210-2 provides connectivity to node 320-2; the contact 1210-1 provides connectivity to node 320-1; the contact 1210-4 provides connectivity to layer of material 610 at region 410-2.

Figure 13A:
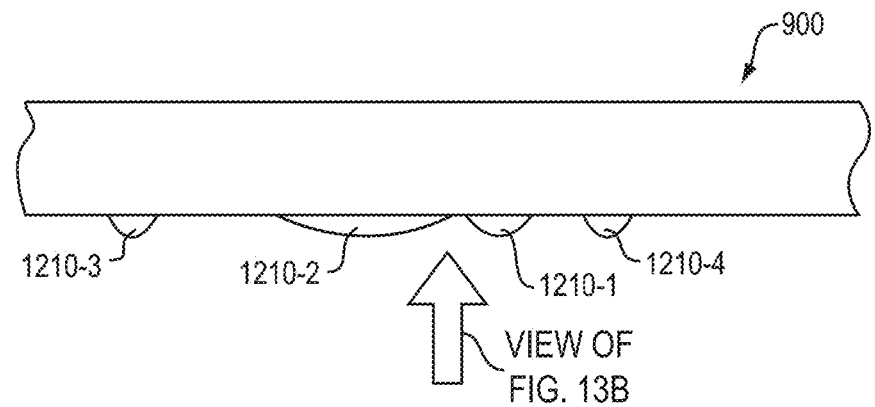
FIG. 13A is an example side view diagram of an electronic circuit package according to embodiments herein.
Figure 13B:
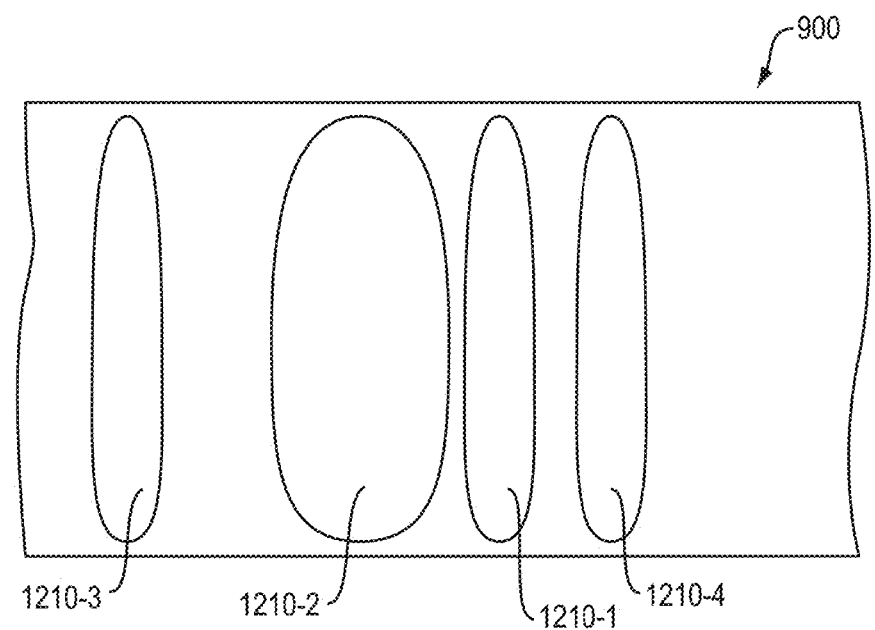
FIG. 13B is an example under view diagram of an electronic circuit package according to embodiments herein.

FIG. 13A is an example side view diagram of an electronic circuit package according to embodiments herein. FIG. 13B is an example top view diagram of an electronic circuit package according to embodiments herein.

As shown, FIG. 13A shows a singulated and finished assembly 900 as an electronic circuit package. As shown in FIG. 13B, the assembly 900 can include a source node, a drain node, an multiple drain nodes that is fully compatible to SMT.

Alternative Embodiments Using a Plate Instead of a 2nd Overmold Layer 830

As alternative to processing as discussed above in FIG. 8, embodiments herein can include continuing processing after FIG. 6 or FIG. 7 with all or a portion of the processing as discussed below in FIGS. 14-18. The additional processing in FIGS. 9-12 can be used to remove the substrate 110 and adhesive layer 115 and to produce an electronic circuit package in a manner as previously discussed.

In lieu of the overmold layer 830, a respective electronic circuit package includes a metal plate, heat sink, etc., as discussed below.

For example, instead of using an overmold layer 830, a plate (of a material such as metal) can provide rigidity to an electronic circuit assembly. The benefit of using a plate instead of the overmold layer 830 is shown by the better thermal properties of metal or steel, so this variation is most suitable for power-type chips (e.g., field effect transistors, etc.) operating in a higher power application.

Figure 14:
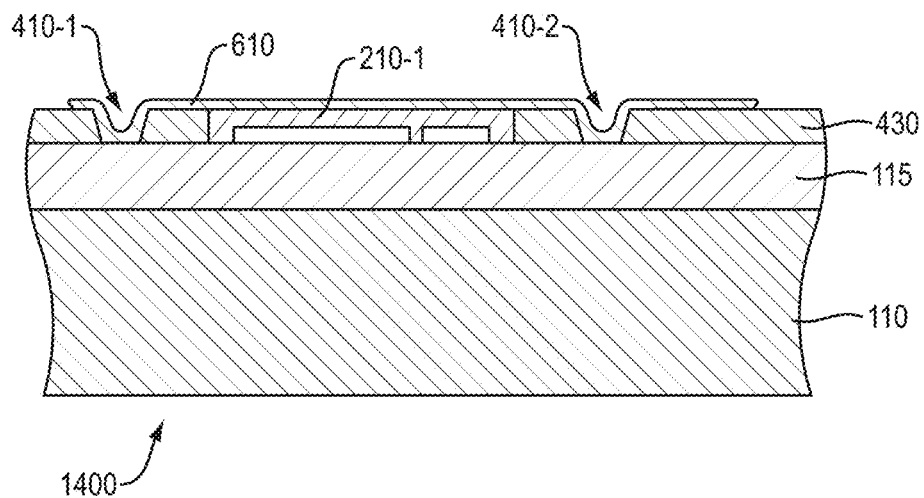
FIG. 14 is an example side view diagram illustrating deposition of a uniform layer of metal on a surface of an electronic circuit assembly according to embodiments herein.

FIG. 14 is an example side view diagram illustrating deposition of a uniform layer of metal on a surface of an electronic circuit assembly according to embodiments herein.

As shown, assembly 1400 includes layer of material 610 creating an ohmic contact to the backside of the circuit device 210-1 as well as a first overmold layer 430. As previously discussed, the layer of material 610 provides connectivity between the ohmic contact on the backside of the circuit device 210-1 to areas such as regions 410-1 and 410-2.

Figure 15:
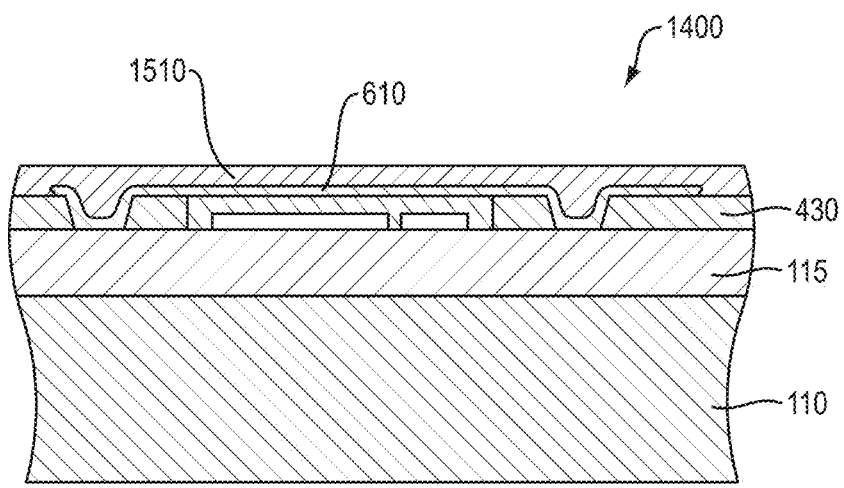
FIG. 15 is an example side view diagram illustrating application of an adhesive layer according to embodiments herein.

FIG. 15 is an example side view diagram illustrating application of an adhesive layer according to embodiments herein.

As shown, further processing of assembly 1400 includes applying a conductive adhesive layer 1510 over the layer of material 610 and/or surrounding exposed areas. In one embodiment, fabrication includes applying the conductive adhesive layer 1510 (e.g., thermally and/or electrically conductive material) via a process such as a stencil printing. By further way of a non-limiting example, the conductive adhesive layer may be uniform. That is, it may not have any structure or openings. Applying the conductive adhesive layer 1510 via an operation such as stencil printing ensures that the conductive adhesive layer fills in any voids in the overmold layer 430.

Figure 16:
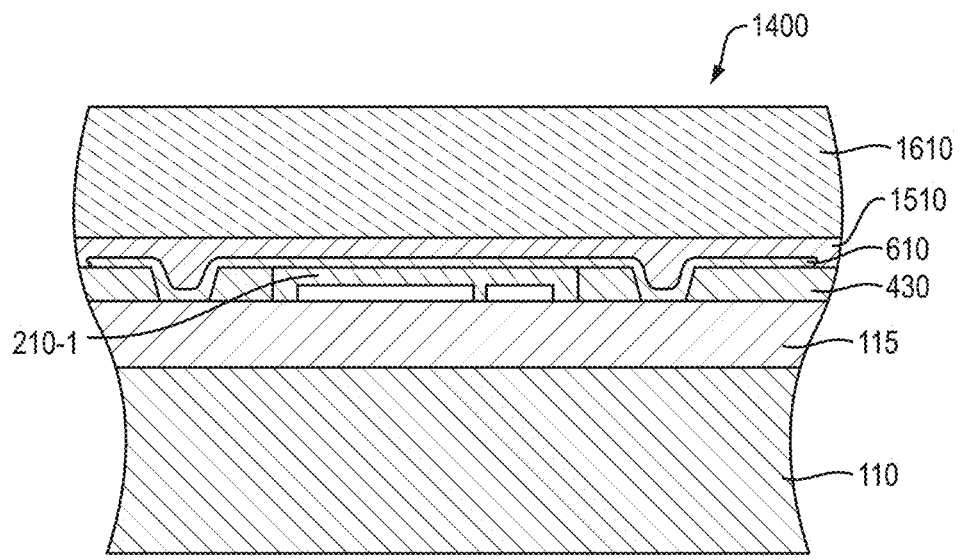
FIG. 16 is an example side view diagram illustrating a plate bonded to a topside surface of a circuit assembly according to embodiments herein.

FIG. 16 is an example side view diagram illustrating a plate 1610 bonded to a surface of a circuit assembly 1400 according to embodiments herein.

In one embodiment in which the conductive adhesive layer 1510 is electrically conductive, it will also have good thermal conductive properties. For example, it will readily support a transfer of heat away from the circuit device 210-1. In one embodiment, heat generated by the circuit device 210-1 will be conducted from the circuit device 210-1 through the adhesive layer 1510 to the plate 1610. The plate 1610 dissipates the heat to the ambient air by Eiher forces or natural convection.

Examples of different possible shapes of the plate 1610 as a heat sink are shown in FIG. 18.

Note again that embodiments herein can further include the processing in FIGS. 9-12 to perform operations such as removal of the substrate 110 and adhesive layer 115 from assembly 1400, adding of contacts 1210, etc.

Figure 17:
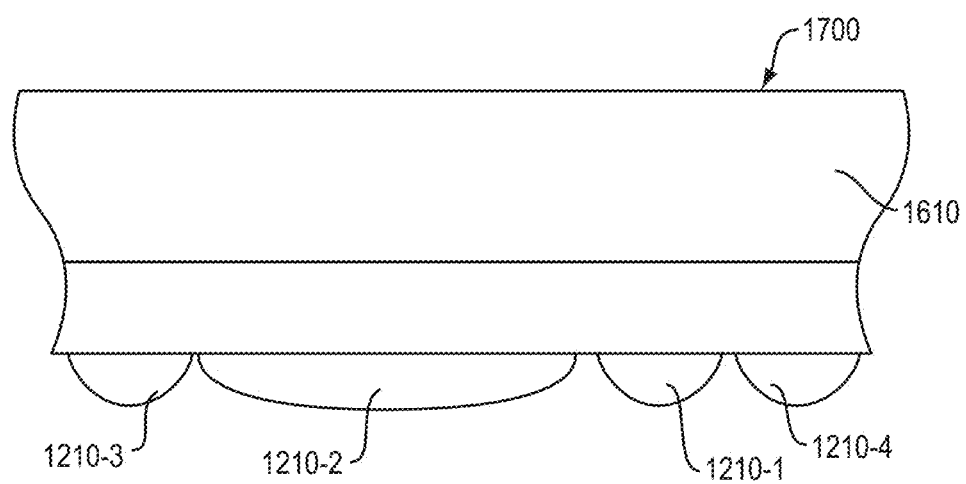
FIG. 17 is an example diagram illustrating a side view of an electronic circuit package according to embodiments herein.
Figure 18A:
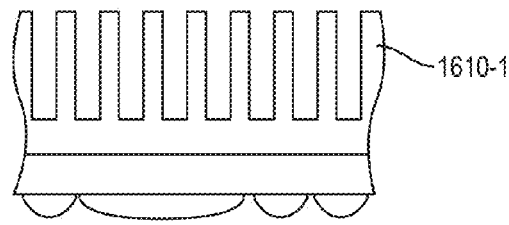
FIG. 18 is an example diagram illustrating shapes of different heat sink options according to embodiments herein.
Figure 18B:
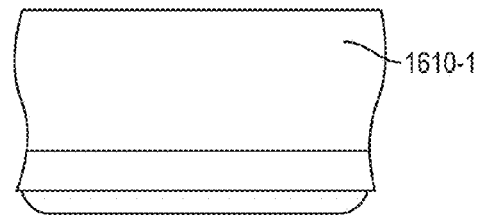
Figure 18C:
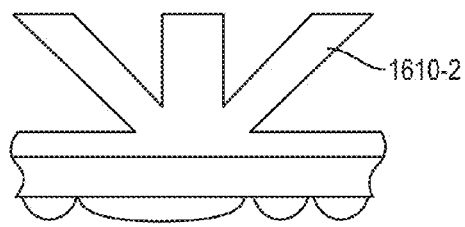
Figure 18D:
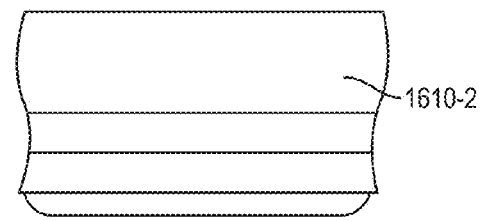

FIG. 17 is an example diagram illustrating a side view of an electronic circuit package after removal of the substrate 110 and singulation according to embodiments herein.

As shown, the electronic circuit package 1700 includes plate 1610. In a manner as previously discussed, contacts 1210 disposed on the underfacing of the electronic circuit package 1700 provide connectivity to the circuit device 210-1.

Figure 19:
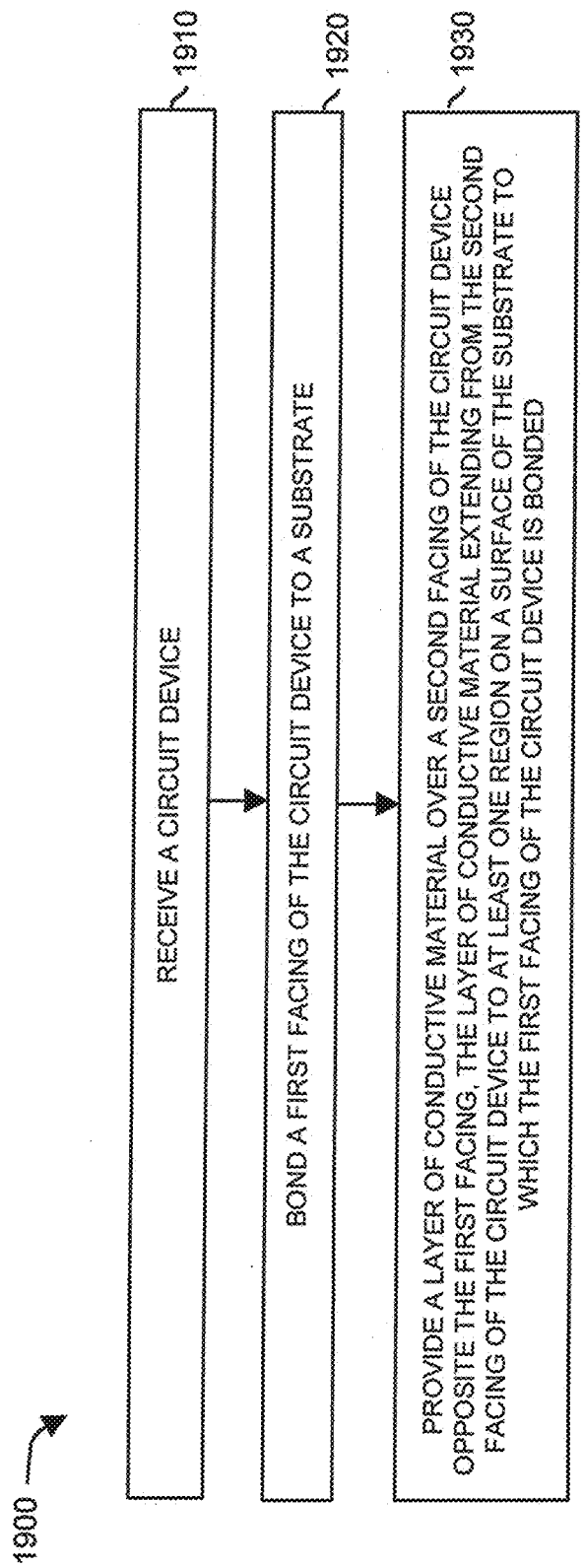
FIG. 19 is an example diagram illustrating a method of fabricating an electronic circuit package using wafer-level processing techniques according to embodiments herein.

FIG. 19 is an example diagram illustrating steps of fabricating an electronic circuit package according to embodiments herein.

In step 1910, an assembler receives a circuit device 210-1.

In step 1920, the assembler bonds a first facing 310-1 of the circuit device 210-1 to a substrate 110.

In step 1930, the assembler provides a layer of material 610 such as conductive material over a second facing 510-2 of the circuit device 210-1 disposed opposite the first facing 310-1. The layer of conductive material 610 extends from the second facing 510-2 of the circuit device 210-1 to at least one region 410 on a surface of the substrate 110 to which the first facing 310-1 of the circuit device 210-1 is bonded.

Figure 20:
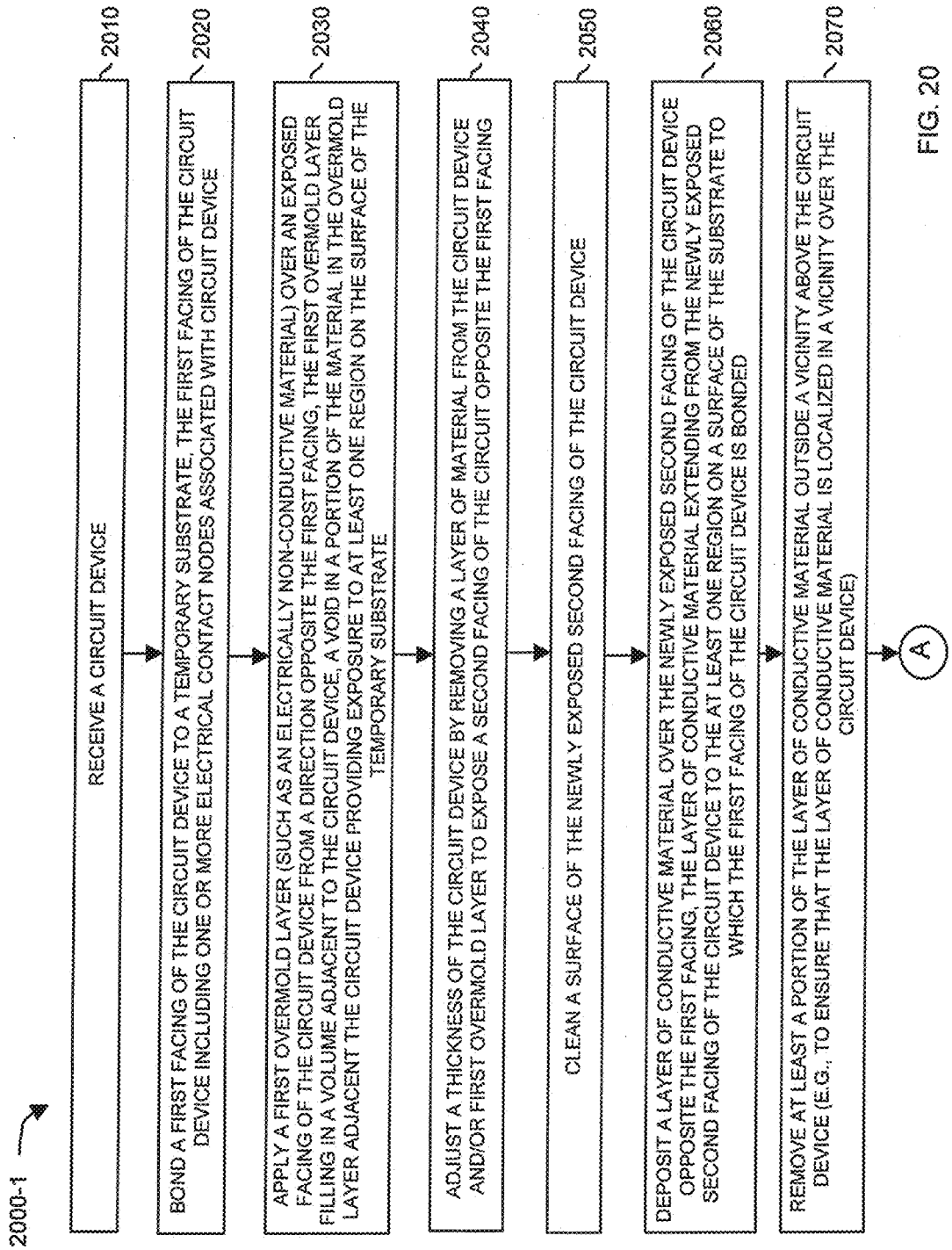
FIGS. 20-21 combine to form an example diagram illustrating a method of fabricating an electronic circuit package using wafer-level processing techniques according to embodiments herein.
Figure 21:
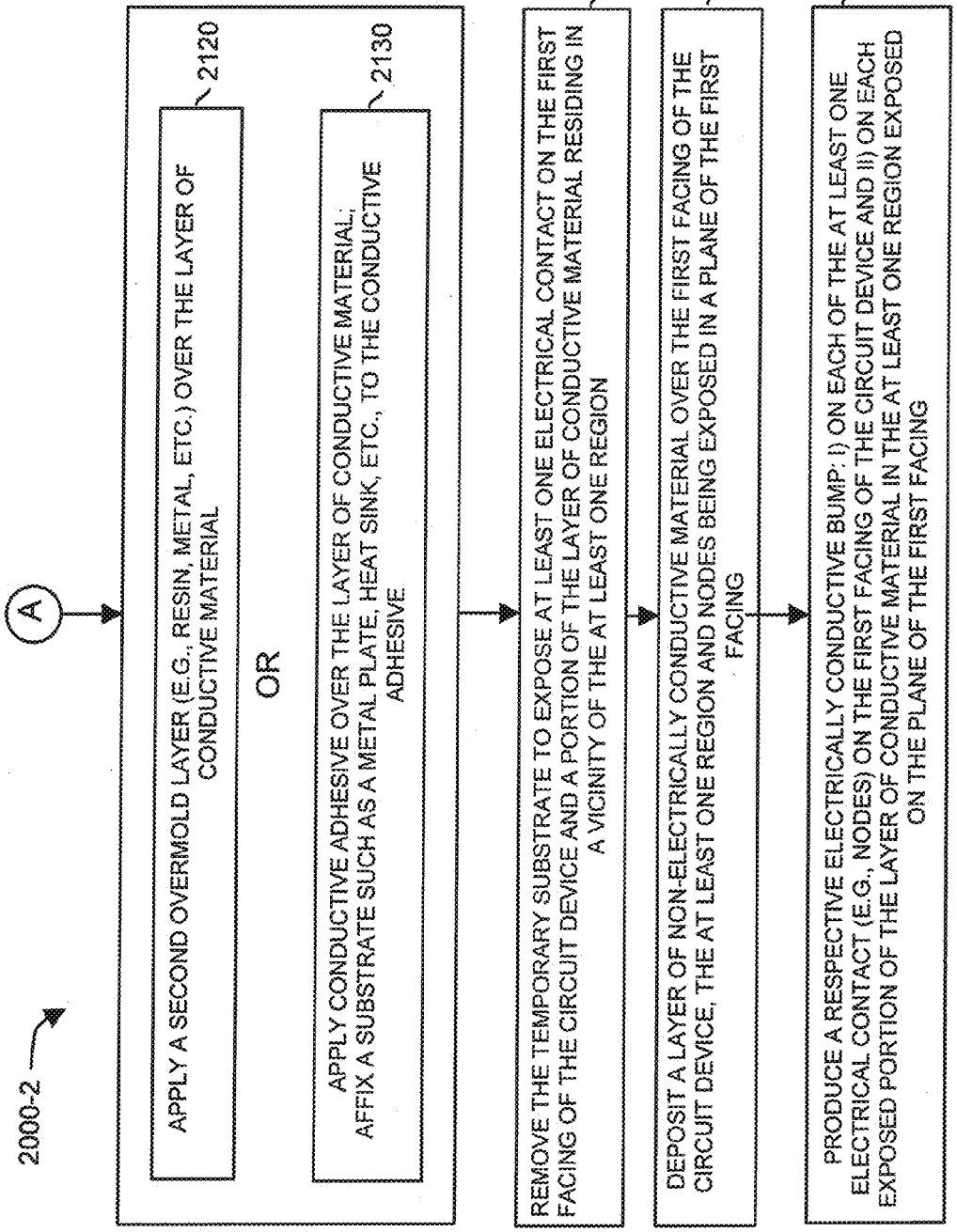

FIGS. 20 and 21 combine to form flowchart 2000 (e.g., flowchart 2000-1 and flowchart 2000-2) is an example diagram illustrating steps of fabricating an electronic circuit package according to embodiments herein.

In step 2010, the assembler receives a circuit device 210-1.

In step 2020, the assembler bonds a first facing 310-1 of the circuit device 210-1 to a (temporary) substrate 110. The first facing 310-1 of the circuit device 210-1 includes one or more electrical contact nodes 320 associated with circuit device 210-1.

In step 2030, the assembler applies a first overmold layer 430 (such as an electrically non-conductive material) over an exposed facing of the circuit device 210-1 from a direction opposite the first facing (e.g., on facing 310-2). The first overmold layer 430 fills a volume adjacent to the circuit device 210-1. A void in a portion of the material in the overmold layer 430 adjacent the circuit device 210-1 provides exposure from a top-side of the assembly to at least one region 410 on the surface of the (temporary) substrate 110.

In step 2040, the assembler adjusts or modifies a thickness of the circuit device 210-1 by removing a layer of material from the circuit device 210-1 and/or first overmold layer 430 to create and expose facing 510-2 of the circuit device 210-1 opposite the first facing 310-1.

In step 2050, the assembler cleans and potentially further processes a surface of the newly created and exposed facing 510-2 of the circuit device 210-1.

In step 2060, the assembler deposits a layer of conductive material 610 over the newly exposed second facing 510-2 of the circuit device 210-1 opposite the first facing 310-1. In one embodiment, the layer of conductive material 610 extends from the newly exposed second facing 510-2 of the circuit device 210-1 to the at least one region 410 on a surface of the substrate 110 to which the first facing 310-1 of the circuit device 210-1 is bonded.

In step 2070, the assembler removes at least a portion of the layer of conductive material 610 outside a vicinity above the circuit device 210-1 to ensure that the layer of conductive material 610 is generally localized in a vicinity over the circuit device 210-1.

In step 2120, the assembler applies a second overmold layer 830 (e.g., resin, metal, etc.) over the layer of conductive material 610.

OR

As an alternative to step 2120, in step 2130 the assembler applies conductive adhesive 1510 to the layer of conductive material 610. Further in step 2130, the assembler affixes a substrate 1610 such as a metal plate, heat sink, etc., to the conductive adhesive 1510.

In step 2140, the assembler removes the substrate 110 to expose nodes 320 (e.g., electrical input/output contacts) on the first facing 310-1 of the circuit device 210-1 and a portion of the layer of conductive material 610 residing in a vicinity of the region 410 (e.g., void in the overmold layer 430).

In step 2150, the assembler deposits a layer of non-electrically conductive material (e.g., layer 1010) over a portion of the first facing 310-1 of the circuit device 210-1. The regions 410 and nodes 320 are exposed in a plane of the first facing 310-1.

In step 2160, the assembler produces a respective electrically conductive contact 1210 such as a bump: i) on each of the at least one electrical contact (e.g., nodes) on the first facing 310-1 of the circuit device 210-1 and ii) on each exposed portion of the layer of conductive material 610 in the at least one region 410 exposed on the plane of the first facing 310-1. The contacts 1210 can be solder bumps for subsequently mounting the circuit device 210-1 on a printed circuit board.

Techniques herein are well suited for use in electronic circuit package fabrication and power supply circuitry. However, it should be noted that embodiments herein are not limited to use in such applications and that the techniques discussed herein are well suited for use in other applications as well.

While this invention has been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the invention are presented in the following claims.

We claim:

1. A wafer-level assembly comprising:
 a chip circuit device having a first facing and a second facing;
 a temporary substrate, the first facing of the chip circuit device bonded to the temporary substrate; and
 a layer of conductive material over the second facing of the chip circuit device opposite the first facing, the layer of conductive material extending from the second facing of the chip circuit device to at least one region on a surface of the temporary substrate to which the first facing of the chip circuit device is bonded.

2. The wafer-level assembly as in claim 1, wherein the chip circuit device is a field effect transistor;
 wherein the second facing is a drain node of the field effect transistor; and
 wherein the layer of conductive material over the second facing is electrically coupled to the drain node of the field effect transistor.

3. The wafer-level assembly as in claim 1, wherein the layer of conductive material is deposited over the second facing of the chip circuit device; and
 wherein the at least one region is disposed adjacent to the chip circuit device.

4. The wafer-level assembly as in claim 1, wherein the chip circuit device is a field effect transistor including a source node and a gate node disposed on the first facing; and
 wherein the circuit device includes a drain node on the second facing, the layer of conductive material providing an electrical path from the second facing to the at least one region.

5. An electronic circuit package comprising:
 a circuit device having a first facing and second facing, the first facing disposed opposite the second facing;
 at least one electrical contact node of the circuit device disposed on the first facing;
 at least one electrical contact node of the circuit device disposed on the second facing; and
 a wafer-level layer of conductive material deposited on the second facing, the wafer-level layer of conductive material contacting the at least one electrical contact node disposed on the second facing and extending from the second facing to at least one region substantially in a plane of the first facing.

6. The electronic circuit package as in claim 5, wherein the at least one region is located adjacent the circuit device and the wafer-level layer of conductive material provides a fan-out from a node on the second facing to the plane of the first facing.

7. The electronic circuit package as in claim 5, wherein the wafer-level layer of conductive material includes electrically conductive material deposited over the second facing.

8. The electronic circuit package as in claim 5 further comprising:
 at least a portion of an overmold layer filling a volume adjacent the circuit device between the wafer-level layer of conductive material and the planar surface of the first facing.

9. The electronic circuit package as in claim 5, wherein the circuit device is a vertical field effect transistor, the first facing of the circuit device including a gate node and a source node of the vertical field effect transistor, the second facing of the circuit device including a drain node of the field effect transistor.

10. The wafer-level assembly as in claim 1, wherein the second facing is a facing of a remaining portion of the chip circuit device after removal of a layer of material from the chip circuit device.

11. The wafer-level assembly as in claim 10, wherein the layer of conductive material is deposited over the second facing of the chip circuit device to provide an electrical path from the second facing to the at least one region on the surface of the temporary substrate, the at least one region being an electrically non-conductive region of the substrate.

12. The wafer-level assembly as in claim 11, wherein the chip circuit device is a field effect transistor including a source node and a gate node disposed on the first facing;

wherein the second facing is a drain node of the field effect transistor, a connection between the drain node and the layer of conductive material being an ohmic contact.

13. The wafer-level assembly as in claim 1 further comprising:
at least a remaining portion of an overmold layer filling a volume adjacent the circuit device between the layer of conductive material and the at least one region on the surface of the temporary substrate; and
wherein the layer of conductive material is a deposited layer of metal.

14. The wafer-level assembly as in claim 1, wherein the chip circuit device is a semiconductor chip fabricated from silicon;
wherein a connection between the second facing and the layer of conductive material is an ohmic contact; and
wherein the at least one region of the surface of the temporary substrate to which the layer of conductive material extends is electrically non-conductive material.

15. The electronic circuit package as in claim 5, wherein the circuit device is a semiconductor chip.

16. The electronic circuit package as in claim 5, wherein the second facing is disposed on a remaining portion of the circuit device after removal of a layer of material from the circuit device.

17. The wafer-level assembly as in claim 5, wherein the circuit device is a field effect transistor including a source node and a gate node disposed on the first facing;
wherein the second facing is a drain node of the field effect transistor, a connection between the second facing and the drain node being an ohmic contact; and
wherein the wafer-level layer of conductive material over the second facing is electrically coupled to the drain node of the field effect transistor.

18. The wafer-level assembly as in claim 5, wherein the circuit device is a semiconductor chip fabricated from silicon; and
wherein a connection between the second facing and the wafer-level layer of conductive material is an ohmic contact.

* * * * *